(12) United States Patent
Milsom et al.

(10) Patent No.: US 7,522,018 B2
(45) Date of Patent: Apr. 21, 2009

(54) ELECTRO-ACOUSTIC RESONATOR WITH A TOP ELECTRODE LAYER THINNER THAN A BOTTOM ELECTRODE LAYER

(75) Inventors: Robert Frederick Milsom, Redhill (GB); Hans-Peter Löbl, Monschau-Imgenbroich (DE)

(73) Assignee: NXP B.V., Eindhoven (NL)

( * ) Notice: Subject to any disclaimer, the term of this patent is extended or adjusted under 35 U.S.C. 154(b) by 330 days.

(21) Appl. No.: 10/538,110

(22) PCT Filed: Dec. 4, 2003

(86) PCT No.: PCT/IB03/05675

§ 371 (c)(1),
(2), (4) Date: Dec. 14, 2005

(87) PCT Pub. No.: WO2004/053798

PCT Pub. Date: Jun. 24, 2004

(65) Prior Publication Data

US 2006/0131990 A1    Jun. 22, 2006

(30) Foreign Application Priority Data

Dec. 13, 2002    (EP) .................. 02258613

(51) Int. Cl.
*H03H 9/13* (2006.01)
*H03H 9/15* (2006.01)
*H03H 9/54* (2006.01)

(52) U.S. Cl. .............. 333/187; 333/189; 310/312; 310/364

(58) Field of Classification Search .......... 333/187, 333/188; 310/312, 364
See application file for complete search history.

(56) References Cited

U.S. PATENT DOCUMENTS

| 5,864,261 | A * | 1/1999 | Weber ................ 333/187 |
| 5,873,154 | A | 2/1999 | Ylilammi et al. |
| 6,051,907 | A | 4/2000 | Ylilammi |
| 6,249,074 | B1 | 6/2001 | Zimnicki et al. |
| 6,291,931 | B1 * | 9/2001 | Lakin ................ 310/364 |
| 6,710,508 | B2 * | 3/2004 | Ruby et al. .......... 310/312 |
| 6,874,211 | B2 * | 4/2005 | Bradley et al. ........ 29/25.35 |
| 2006/0220763 | A1 * | 10/2006 | Iwasaki et al. ......... 333/133 |

FOREIGN PATENT DOCUMENTS

EP    1152475 A1    11/2001
WO    WO0223720 A1    3/2002

* cited by examiner

*Primary Examiner*—Barbara Summons
(74) *Attorney, Agent, or Firm*—Aaron Waxler

(57) ABSTRACT

An electro-acoustic resonator (1, 8, 17) of the membrane or FBAR type (1) or the solidly-mounted or SBAR type (8), with electrodes comprising a single conducting layer or multiple conducting layers, i.e. sandwich construction (17) with an optimum coupling factor kr and thus an improved filter bandwidth. The optimum coupling factor kr is achieved by the arrangement that the top electrode (6, 15, 25) is thinner than the bottom electrode (4, 13, 23). The coupling factor is independent of the resonator's layout defined by the mask.

14 Claims, 5 Drawing Sheets

FIG. 4

Figure 1:
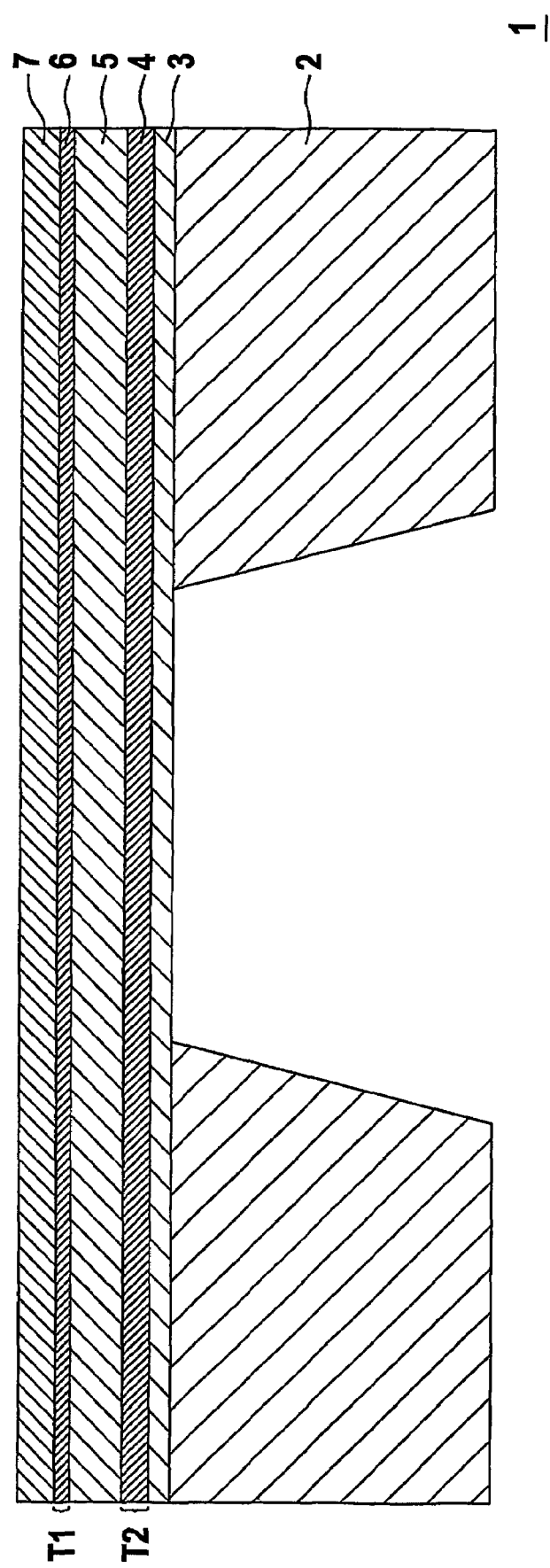

| T4 \ T3 | 50 nm | 100 nm | 150 nm | 200 nm | 250 nm | 300 nm |
|---|---|---|---|---|---|---|
| 100 nm | 0,216 | 0,219 | 0,218 | 0,218 | 0,212 | 0,208 |
| 150 nm | 0,216 | 0,219 | 0,223 | 0,218 | 0,219 | 0,216 |
| 200 nm | 0,220 | 0,224 | 0,222 | 0,224 | 0,224 | 0,220 |
| 250 nm | 0,216 | 0,219 | 0,224 | 0,226 | 0,219 | 0,216 |
| 300 nm | 0,223 | 0,226 | 0,224 | 0,226 | 0,218 | 0,223 |
| 350 nm | 0,214 | 0,218 | 0,224 | 0,226 | 0,218 | 0,214 |
| 400 nm | | | 0,223 | 0,217 | 0,217 | 0,213 |

FIG. 5

| T4 \ T3 | 50 nm | 100 nm | 150 nm | 200 nm | 250 nm | 300 nm |
|---|---|---|---|---|---|---|
| 100 nm | 0,214 | 0,216 | 0,216 | 0,214 | 0,212 | 0,209 |
| 150 nm | 0,218 | 0,219 | 0,219 | 0,218 | 0,216 | 0,213 |
| 200 nm | 0,219 | 0,222 | 0,222 | 0,221 | 0,218 | 0,214 |
| 250 nm | 0,221 | 0,223 | 0,223 | 0,222 | 0,219 | 0,217 |
| 300 nm | 0,219 | 0,223 | 0,223 | 0,222 | 0,219 | 0,217 |
| 350 nm | | 0,223 | 0,222 | 0,221 | 0,218 | 0,216 |
| 400 nm | | | | | | |

| T6 \ T6 | 0 nm | 50 nm | 100 nm | 150 nm | 200 nm | 250 nm |
|---|---|---|---|---|---|---|
| 0 nm | 0,204 | 0,202 | 0,198 | 0,191 | 0,191 | 0,181 |
| 50 nm | 0,207 | 0,212 | 0,208 | 0,203 | 0,194 | 0,192 |
| 100 nm | 0,209 | 0,216 | 0,211 | 0,204 | 0,204 | 0,194 |
| 150 nm | 0,209 | 0,216 | 0,211 | 0,213 | 0,203 | 0,192 |
| 200 nm | 0,213 | 0,211 | 0,216 | 0,208 | 0,196 | 0,183 |
| 250 nm | 0,207 | 0,214 | 0,208 | 0,199 | 0,185 | 0,171 |

FIG.6

| T5 \ T6 | 0 nm | 50 nm | 100 nm | 150 nm | 200 nm | 250 nm |
|---|---|---|---|---|---|---|
| 0 nm | 0,204 | 0,204 | 0,198 | 0,191 | 0,184 | 0,177 |
| 50 nm | 0,212 | 0,212 | 0,208 | 0,201 | 0,194 | 0,186 |
| 100 nm | 0,214 | 0,216 | 0,213 | 0,207 | 0,198 | 0,190 |
| 150 nm | 0,216 | 0,218 | 0,214 | 0,216 | 0,198 | 0,180 |
| 200 nm | 0,213 | 0,216 | 0,212 | 0,204 | 0,194 | 0,183 |
| 250 nm | 0,208 | 0,212 | 0,206 | 0,198 | 0,187 | 0,175 |

FIG.7

ABSTRACT# ELECTRO-ACOUSTIC RESONATOR WITH A TOP ELECTRODE LAYER THINNER THAN A BOTTOM ELECTRODE LAYER

The invention relates to an electro-acoustic wave resonator. Resonators are the basic building blocks of filters.

Thin-film bulk acoustic wave (BAW) resonator filters are of growing interest particularly for radio frequency (RF) front-end selectivity in wireless applications, e.g. 2G and 3G handsets. This technology offers the best possibility for integration and miniaturisation. One of the important parameters of an electro-acoustic resonator is its coupling factor $k_r$ defined by $k_r^2=[1-(f_r/f_a)^2]$. In this equation $f_r$ and $f_a$ are the resonator's resonance and antiresonance, i.e. the frequencies of minimum and maximum impedance. Maximum achievable filter bandwidth is proportional to $k_r^2$.

A BAW resonator consists essentially of a layer sequence comprising two electrode layers adjacent to a piezoelectric layer. For RF applications the piezoelectric layer typically consists of a deposited layer of a material such as aluminium nitride (AlN). For reducing deposition time, resonators with a feasibly thin piezoelectric layer are desired. The disadvantage of thin-film piezoelectric materials is their rather low coupling coefficient $k_t$. As resonator coupling factor $k_r$ is proportional to the coupling coefficient $k_t$ the design of the electro-acoustic resonator has to be optimised to compensate the rather low coupling coefficient $k_t$ of thin-film piezoelectric materials. For example, a high coupling factor $k_r$ is required for the 3G UMTS receive (RX) and transmit (TX) bands.

WO 02/23720 A1 discloses a resonator that comprises a first electrode, a second electrode and a piezoelectric layer arranged between the above. A first acoustic compression layer is arranged between the piezoelectric layer and the first electrode with a higher acoustic impedance than the first electrode. For a warranty of a sufficiently low resistance of the electrodes that document reveals that the electrodes are at least 200 nm thick. There, the electrode preferably consists of Aluminium (Al) with a thickness of 300-600 nm. Such an electrode results in a low electrical resistance and effects only a small deterioration of the coupling coefficient achieved by the arrangement of an acoustic compression layer.

U.S. Pat. No. 6,051,907 discloses a method for tuning a thin-film bulk acoustic wave resonator (FBAR) located on a wafer. The method is used for fine tuning if the centre frequency is different from a target value and is done by etching the top electrode. According to U.S. Pat. No. 6,051,907 the structure of thin-film bulk acoustic wave resonators formed on wafers is altered before the wafer is diced. That method effects that the FBAR exhibits a series or parallel resonant frequency that is within an acceptable error margin of a design series or parallel resonant frequency, respectively. In one example of U.S. Pat. No. 6,051,907 the top and the bottom electrode both comprise molybdenum (Mo) having a thickness of 300 nm. As the method for fine tuning in that document is based on thinning of the top electrodes of the FBARs, which results in increasing series resistance of the FBARs, there it is proposed to design top electrodes (of Mo) with a thickness of 400 nm and with a correspondingly thinner layer of piezoelectric material, in this case zinc-oxide (ZnO).

The objective of the invention is to provide an electro-acoustic resonator which will give increased filter bandwidth.

This objective is achieved by an electro-acoustic resonator with a layer structure comprising a piezoelectric layer and a top and a bottom electrode layer, with the thickness of the two electrode layers being unequal and with the top electrode layer being thinner than the bottom electrode layer. In this configuration maximum resonator coupling factor is achieved. The enhancement occurs due to an improved match, inside the piezoelectric layer, between the spatial distributions of the applied electric field (which is approximately constant in the direction normal to the layer) and the electric field directly coupled to the acoustic wave (which is approximately cosinusoidal about a plane midway between thin electrodes, but closer to constant for optimal electrode thickness).

The electro-acoustic resonator may be a solidly-mounted thin-film resonator (SBAR) or may have a membrane structure, also referred to as a film bulk acoustic wave resonator (FBAR). The layer sequence of an FBAR is typically etch-stop layer/bottom electrode layer/piezoelectric layer/top electrode layer. The energy is confined by having a perfect reflector at the free-space interface above and below the resonator. The layer sequence of an SBAR is typically substrate/Bragg reflector/bottom electrode layer/piezoelectric layer/top electrode layer. The Bragg reflector comprises alternate high and low mechanical impedance layers and provides the required reflection below the resonator. A mass-loading layer above the top electrode is included in a subset of the resonators in a typical filter design. The mass-loaded resonators have slightly lower $f_r$ and $f_a$ than the non-mass-loaded resonators. In all cases the resonant frequency is approximately inversely proportional to the thickness of the piezoelectric layer. For typical RF applications all layer thicknesses are of the order of 100 nm to 2000 nm. The substrate thickness is typically of the order of 0.1 mm to 2 mm.

At least one of the electrode layers of the electro-acoustic resonator can be formed by a stack of two (or more) conductive materials. Such a configuration is referred to here as a "sandwich" structure. The conductive materials have to be carefully chosen as they influence the electrical loss and the bandwidth.

In one embodiment of the electro-acoustic resonator a conductive thin diffusion barrier is formed between the electrode layers.

In a further embodiment the conductive material in the stack that is in contact with the piezoelectric layer has a higher acoustic impedance than the conductive material that is not in contact with the piezoelectric layer.

In another embodiment the conductive material in the stack that is in contact with the piezoelectric layer has a lower acoustic impedance than the outer conductive material that is not in contact with the piezoelectric layer. Preferably, the outer conductive material is a noble metal such as gold (Au) or platinum (Pt) which protects the resonator's surface.

The conductive material with the lower acoustic impedance preferably comprises aluminium (Al).

The conductive material with the higher acoustic impedance comprises for example platinum (Pt), tungsten (W), molybdenum (Mo), titan-tungsten ($Ti_xW_{1-x}$, $0<x<1$) or gold (Au).

The diffusion barrier between the electrode layers and/or between the electrodes may consist of titanium nitride (TiN) or titanium (Ti) or may consist of combinations of titanium nitride (TiN) and titanium (Ti).

For example, the inventive electro-acoustic resonator can be used in a filter with a centre frequency of 1.95 GHz. This is the centre frequency corresponding to the transmission (TX) band of the UMTS 3G standard. For this application the bandwidth required is very close to the maximum achievable using aluminium nitride for the piezoelectric layer.

One preferred embodiment, for use in filters with centre frequency in the region of 2 GHz, is an electro-acoustic resonator whose electrode layers comprise molybdenum with, for a resonant frequency in the region of 2 GHz, the top layer's thickness being in the region of 200 nm and the bottom layer's thickness being the region of 300 nm, these thicknesses scaling approximately inversely with resonant frequency.

Another preferred embodiment is an electro-acoustic resonator whose electrode layers comprise platinum with, for a resonant frequency in the region of 2 GHz, the top layer's thickness being in the region of 50 nm and the bottom layer's thickness being in the region of 150 nm, these thicknesses scaling approximately inversely with resonant frequency.

The inventive electro-acoustic resonator may be used as a component of a radio frequency (RF) filter, or as a component used in a sensor, or used in an ultrasonic transducer, or used in an array of ultrasonic transducers.

Figure 2:
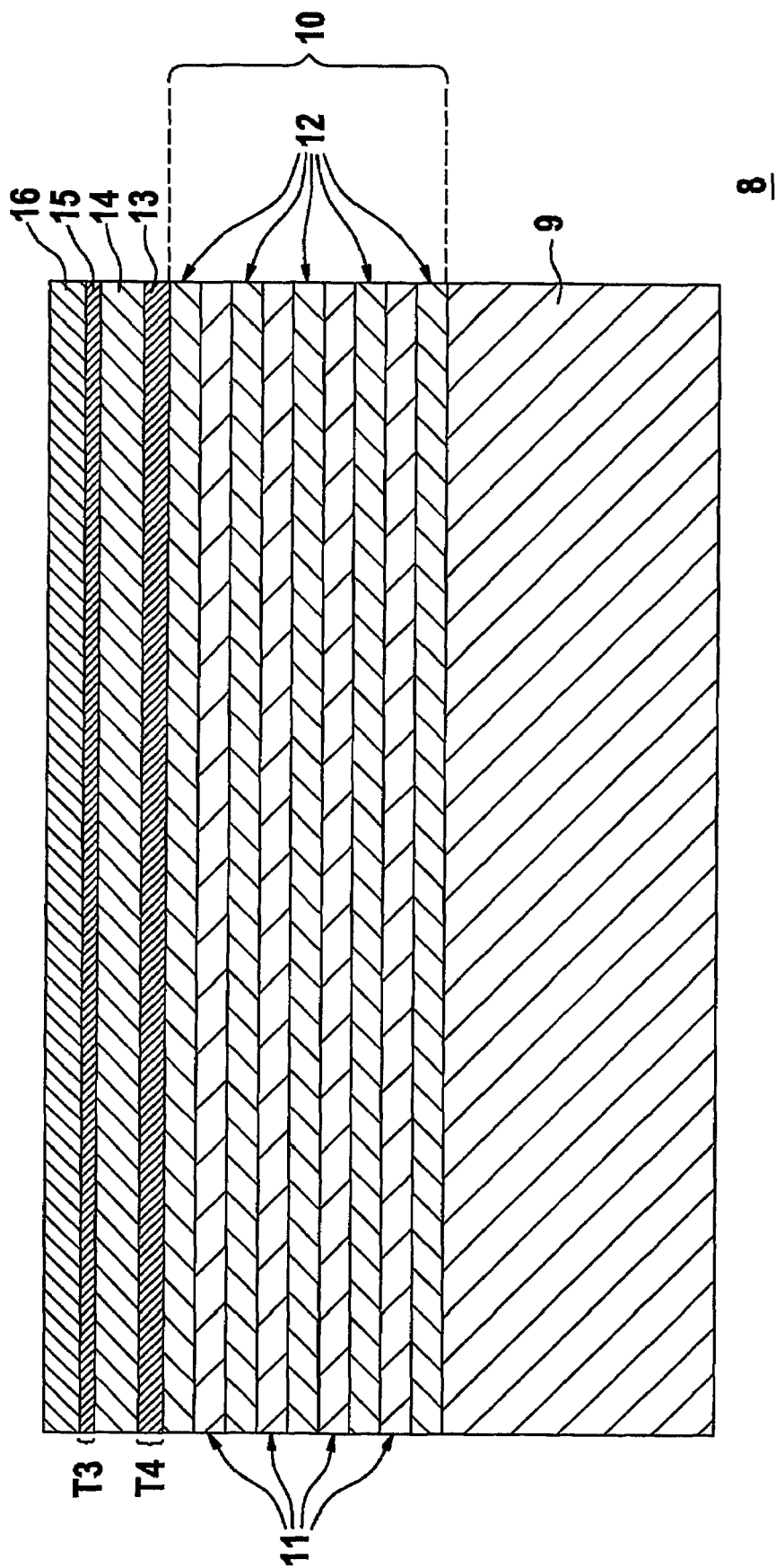
Figure 3:
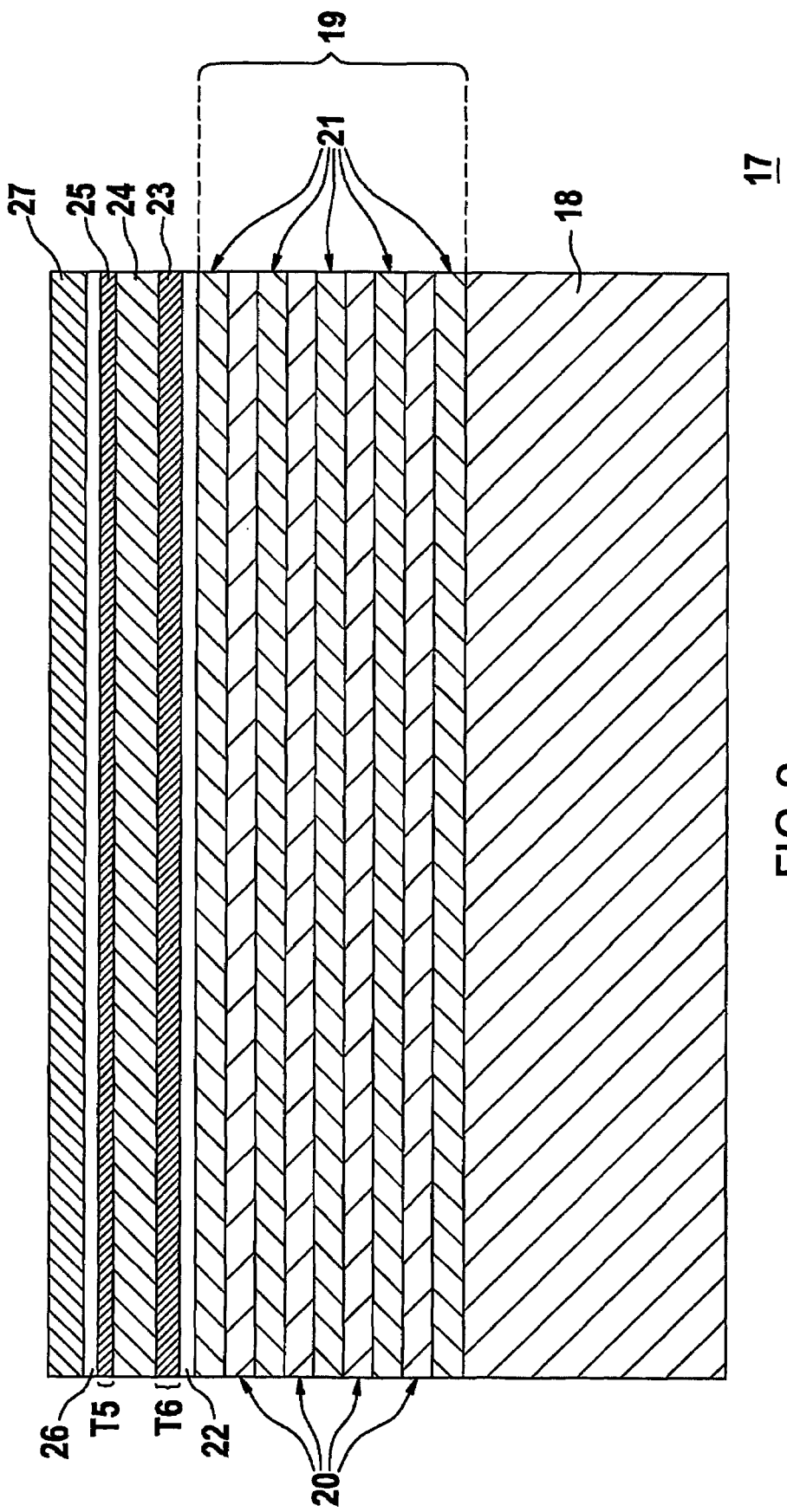

These and other aspects of the invention will become apparent from and will be elucidated with reference to the embodiments described hereinafter, where FIG. 1 illustrates a layer sequence in an FBAR, FIG. 2 illustrates a layer sequence in an SBAR, FIG. 3 illustrates a layer sequence in a sandwich SBAR, FIG. 4 illustrates a table with the coupling factor versus the thicknesses of top and bottom electrode for a non-mass-loaded SBAR, FIG. 5 illustrates a table with the coupling factor versus the thicknesses of top and bottom electrode for a mass-loaded SBAR, FIG. 6 illustrates a table with the coupling factor versus the thicknesses of top and bottom electrode for a non-mass-loaded sandwich SBAR, FIG. 7 illustrates a table with the coupling factor versus the thicknesses of top and bottom electrode for a mass-loaded sandwich SBAR.

FIG. 1 illustrates a layer sequence in an FBAR 1 consisting of, from bottom to top, a substrate 2, an etch-stop layer 3, a bottom electrode layer 4, a piezoelectric layer 5, a top electrode layer 6 and a mass-loading layer 7. The FBAR 1 shows the electrode layers 4, 6 with unequal thicknesses with the top electrode 6 having a thickness of T1 and the bottom electrode 4 having a thickness of T2. According to the invention T1 is smaller than T2. This asymmetrical arrangement enables the resonator to achieve maximum coupling-factor, thus giving maximum filter bandwidth.

FIG. 2 illustrates a layer sequence in an SBAR 8 consisting of, from bottom to top, a substrate 9, an acoustic mirror 10 like a Bragg reflector comprising alternate high 11 and low 12 mechanical impedance layers, a bottom electrode layer 13, a piezoelectric layer 14, a top electrode layer 15 and a mass-loading layer 16. The SBAR 8 shows electrode layers 13, 15 with unequal thicknesses with the top electrode 15 having a thickness of T3 and the bottom electrode 13 having a thickness of T4. According to the invention thickness T3 is smaller than thickness T4.

FIG. 3 illustrates a layer sequence in a sandwich SBAR 17 consisting of, from bottom to top, a substrate 18, an acoustic mirror 19 like a Bragg reflector comprising alternate high 20 and low 21 mechanical impedance layers, a bottom outer electrode layer 22, a bottom inner electrode layer 23, a piezoelectric layer 24, a top inner electrode layer 25, a top outer electrode layer 26 and a mass-loading layer 27. The sandwich SBAR 17 shows outer electrode layers 22 and 26 of equal thickness, and inner electrode layers 23 and 25 of unequal thickness with the inner top electrode 25 having a thickness of T5 and the inner bottom electrode 23 having a thickness of T6. Between the electrodes 22 and 23 and/or between the electrodes 25 and 26 there may be a diffusion barrier consisting of a layer of e.g. TiN or a combination of layers of Ti and TiN. This diffusion barrier is to avoid inter-diffusion of the two electrode materials 22 and 23 or 25 and 26 respectively. The thickness of the thin diffusion barrier is between 10 and 30 nm and does not change the performance of the resonator substantially.

The mass-loading layer (7 in FIG. 1, 16 in FIG. 2, 27 in FIG. 3) is included in a subset of the resonators in a typical filter. The remaining resonators are non-mass-loaded.

The invention is illustrated by the example of a 1.95 GHz filter for the TX band of the UMTS 3G standard. For this application the bandwidth required is very close to the maximum achievable using aluminium nitride (AlN). In principle, a different optimum combination of layers is required for the mass-loaded and non-mass-loaded resonators. The optimum combinations are applicable to both ladder and lattice implementations of the filter.

FIG. 4 illustrates a table with the coupling factor $k_r$ versus the thickness T3 of the top electrode 15 and versus the thickness T4 of the bottom electrode 13 of the filter's non-mass-loaded SBARs 8 as shown in FIG. 2. The electrode metal is molybdenum (Mo) which has about twice the acoustic impedance of aluminium nitride, and very high quality aluminium nitride layers can be grown on it. Tantalim pentoxide ($Ta_2O_5$) and silicon dioxide ($SiO_2$) are employed as the high and the low impedance layers of the Bragg reflector. According to the table the optimum thicknesses of Molybdenum are seen to be in the region of T3=200 nm for the top electrode 15 and of T4=300 nm for the bottom electrode 13. For this combination the corresponding thickness of the aluminium nitride is 1410 nm, and the corresponding maximum value of $k_r$ is 0.226.

FIG. 5 illustrates a table with the coupling factor $k_r$ versus the thickness T3 of the top electrode 15 and versus the thickness T4 of the bottom electrode 13 for the filter's mass-loaded resonators SBAR 8. The optimum thicknesses of the molybdenum also are seen to be in the region of T3=200 nm for the top electrode 15 and of T4=300 nm for the bottom electrode 13 resulting in a maximum value of kr of 0.222. The mass-loading layer thickness is 150 nm. Other layer thicknesses are the same as for the non-mass-loaded SBARs described in FIG. 4.

The enhancement of the coupling factor kr using the described optimum unequal thicknesses T3 and T4 should be even higher when tungsten (W) is used instead of molybdenum as tungsten has a mechanical impedance some 70% higher than that of molybdenum.

Filter implementation for the same centre frequency using sandwich SBARs is now considered.

FIG. 6 illustrates a table with the coupling factor $k_r$ versus the thickness T5 of the top electrode 25 and versus the thickness T6 of the bottom electrode 23 for the filter's non-mass-loaded sandwich SBARs 17. The outer electrode layers 22, 26 are of aluminium and the inner electrode layers 23, 25 adjacent to the piezoelectric (AlN) layer 24 are of platinum (Pt). To achieve an adequately low electrical resistance it is proposed that the aluminium layers 22, 26 have the same thickness, here set to 200 nm. The top 25 and the bottom 23 electrode layers are the variables. Optimum coupling factor $k_r$ is obtained with values of about T5=50 nm for the top electrode 25 and of about T6=150 nm for the bottom electrode 23 respectively. Between the electrodes 22 and 23 and/or between the electrodes 25 and 26 there may be a diffusion barrier consisting of a layer of e.g. TiN or a combination of layers of Ti and TiN. This diffusion barrier is to avoid inter-diffusion of the two electrode materials 22 and 23 or 25 and 26 respectively. The thickness of the thin diffusion barrier is between 10 and 30 nm and does not change the performance of the resonator substantially.

FIG. 7 illustrates a table with the coupling factor $k_r$ versus the thickness T5 of the top electrode 25 and versus the thickness T6 of the bottom electrode 23 for the filter's mass-loaded SBARs 17. Optimum coupling factor $k_r$ is again obtained with values of about T5=50 nm for the top electrode 25 and of about T6=150 nm for the bottom electrode 23 respectively. Other layer thicknesses are the same as for the non-mass-loaded sandwich SBARs described in FIG. 6.

In both mass-loaded and non-mass-loaded sandwich SBARs optimum thicknesses of the inner Pt electrodes are almost independent of the thicknesses of the Al outer electrodes 22, 26. For optimum Pt layer thicknesses and Al layer thicknesses of 100 nm, 200 nm and 300 nm the coupling factor $k_r$=0.220, 0.216 and 0.202 respectively.

The invention may be summarised by a thin-film bulk acoustic wave resonator (1, 8, 17) of the membrane or FBAR type (1) or the solidly-mounted or SBAR type (8), either with single layer electrodes (1, 8) or of the multiple-layer electrode sandwich construction (17), with an optimum coupling factor $k_r$, and thus increased bandwidth in filters incorporating such resonators. The optimum coupling factor $k_r$ is achieved by the arrangement that the top electrode (6, 15, 25) is thinner than the bottom electrode (4, 13, 23). The coupling factor is independent of the resonator's layout.

The invention claimed is:

1. Electro-acoustic resonator (1, 8, 17) comprising a membrane structure FBAR (1) with a layer structure comprising a piezoelectric layer (5, 14, 24) and a top (6, 15, 25) and a bottom (4, 13, 23) electrode layer, with the thickness (T1, T2, ... T6) of the two electrode layers being unequal, characterised in that the top electrode layer (T1, T3, T5) is thinner than the bottom (T2, T4, T6) electrode layer to increase a filter bandwidth of the electro-acoustic resonator.

2. Electro-acoustic resonator (1, 8, 17) as claimed in claim 1, characterised in that a relative thickness of the two electrode layers maximizes the filter bandwidth.

3. Electro-acoustic resonator (1, 8, 17) as claimed in claim 1, characterised in that at least one of the electrode layers is formed by a stack of conductive materials (25, 26 or 22, 23).

4. Electro-acoustic resonator (1, 8, 17) as claimed in claim 3, characterised in that between the stacked conductive materials of the electrode layers (22 and 23 and/or 25 and 26) a conductive thin diffusion baffler is formed.

5. Electro-acoustic resonator (1, 8, 17) as claimed in claim 4, characterised in that the diffusion baffler between the stacked conductive materials of the electrode layers (22 and 23 and/or 25 and 26) consists of titanium nitride (TiN), or titanium (Ti), or consists of combinations of titanium nitride (TiN) and titanium (Ti).

6. Electro-acoustic resonator (1, 8, 17) as claimed in claim 3, characterised in that in the stack, the conductive material (23, 25) in contact with the piezoelectric layer (24) has a lower acoustic impedance than the conductive material (22, 26) that is not in contact with the piezoelectric layer (24).

7. Electro-acoustic resonator (1, 8, 17) as claimed in claim 3, characterised in that in the stack, the conductive material (23, 25) that is in contact with the piezoelectric layer (24) has a higher acoustic impedance than the conductive material (22, 26) that is not in contact with the piezoelectric layer (24).

8. Electro-acoustic resonator (1, 8, 17) as claimed in claim 7, characterised in that the conductive material with the higher acoustic impedance comprises platinum (Pt), tungsten (W), molybdenum (Mo), titan-tungsten ($Ti_xW_{1-x}$, 0<x<1), Gold (Au).

9. Electro-acoustic (1, 8, 17) resonator as claimed in claim 7, characterised in that the conductive material with the lower acoustic impedance comprises Aluminium (Al).

10. Electro-acoustic resonator (1, 8, 17) as claimed in claim 1, characterised in that the electrode layers (4, 6, 13, 15, 23, 25) comprise Molybdenum (Mo) and that, for a resonant frequency in the region of 2 GHz, the thickness (T1, T3, T5) of the top Molybdenum layer (6, 15,25) is in the region of 200 nm and the thickness (T2, T4, T6) of the bottom Molybdenum layer (4, 13, 23) is in the region of 300 nm, these thicknesses scaling approximately inversely with resonant frequency.

11. Electro-acoustic resonator (1, 8, 17) as claimed in claim 1, characterised in that the electrode layers (4, 6, 13, 15, 23, 25) comprise platinum (Pt) and that, for a resonant frequency in the region of 2 GHz, the thickness (T1, T3, T5) of the top platinum layer (6, 15,25) is in the region of 50 nm and the thickness (T2, T4, T6) of the bottom platinum layer (4, 13, 23) is in the region of 150 nm, these thicknesses scaling approximately inversely with resonant frequency.

12. Use of an electro-acoustic resonator (1, 8, 17) as claimed in claim 1, as a component of a radio frequency (RF) filter, or as a component used in a sensor, or used in an ultrasonic transducer, or used in an array of ultrasonic transducers.

13. Electro-acoustic resonator (1, 8, 17) as claimed in claim 1, characterised in that a relative thickness of the two electrode layers maximizes a coupling factor of the electro-acoustic resonator (1, 8, 17).

14. Electro-acoustic resonator (1, 8, 17) as claimed in claim 1, characterised in that a coupling factor of the electro-acoustic resonator (1, 8, 17) is greater than 0.215.

* * * * *